(12) United States Patent
Kodaira

(10) Patent No.: US 10,522,434 B2
(45) Date of Patent: Dec. 31, 2019

(54) SEMICONDUCTOR DEVICE

(71) Applicant: FUJI ELECTRIC CO., LTD., Kanagawa (JP)

(72) Inventor: Yoshihiro Kodaira, Shenzhen (CN)

(73) Assignee: FUJI ELECTRIC CO., LTD., Kanagawa (JP)

(*) Notice: Subject to any disclaimer, the term of this patent is extended or adjusted under 35 U.S.C. 154(b) by 39 days.

(21) Appl. No.: 15/854,796

(22) Filed: Dec. 27, 2017

(65) Prior Publication Data

US 2018/0122715 A1 May 3, 2018

Related U.S. Application Data

(63) Continuation of application No. PCT/JP2016/086642, filed on Dec. 8, 2016.

(30) Foreign Application Priority Data

Jan. 12, 2016 (JP) .................... 2016-003699

(51) Int. Cl.
| | |
|---|---|
| *H01L 23/055* | (2006.01) |
| *H01L 25/07* | (2006.01) |
| *H01L 25/18* | (2006.01) |
| *H01L 23/13* | (2006.01) |
| *H01L 23/14* | (2006.01) |
| *H01L 23/053* | (2006.01) |

(Continued)

(52) U.S. Cl.
CPC .......... *H01L 23/055* (2013.01); *H01L 23/053* (2013.01); *H01L 23/13* (2013.01); *H01L 23/142* (2013.01); *H01L 23/49811* (2013.01); *H01L 25/07* (2013.01); *H01L 25/072* (2013.01); *H01L 25/18* (2013.01); *H01L 23/49844* (2013.01); *H02M 7/537* (2013.01)

(58) Field of Classification Search
None
See application file for complete search history.

(56) References Cited

U.S. PATENT DOCUMENTS

| | | |
|---|---|---|
| 6,597,585 B2 | 7/2003 | Ferber et al. |
| 2013/0250535 A1 | 9/2013 | Takamiya et al. |
| 2013/0334676 A1 | 12/2013 | Kodaira |

(Continued)

FOREIGN PATENT DOCUMENTS

| | | |
|---|---|---|
| CN | 103210489 A | 7/2013 |
| CN | 103430306 A | 12/2013 |

(Continued)

OTHER PUBLICATIONS

Office Action issued for counterpart Japanese Application 2017-561548, issued by the Japan Patent Office dated Jul. 3, 2018.

(Continued)

*Primary Examiner* — Michelle Mandala

(57) ABSTRACT

A semiconductor device is provided. The semiconductor device includes a terminal portion and a casing portion. The terminal portion has a through hole in a principal surface portion. The casing portion has a depression at a position facing the through hole and has an end surface facing portion facing an end surface of the terminal portion. An end surface protruding portion is provided on at least one of the end surface and the end surface facing portion.

12 Claims, 17 Drawing Sheets

(51) Int. Cl.
*H01L 23/498* (2006.01)
*H02M 7/537* (2006.01)

(56) References Cited

U.S. PATENT DOCUMENTS

| | | | | |
|---|---|---|---|---|
| 2014/0346659 A1* | 11/2014 | Nakamura | ............ | H02M 7/003 |
| | | | | 257/704 |
| 2014/0376184 A1* | 12/2014 | Gohara | ................ | H01L 23/473 |
| | | | | 361/689 |
| 2016/0225685 A1 | 8/2016 | Kodaira | | |

FOREIGN PATENT DOCUMENTS

| | | |
|---|---|---|
| JP | H0515445 U | 2/1993 |
| JP | H11126842 A | 5/1999 |
| WO | 2012066833 A1 | 5/2012 |
| WO | 2012124209 A1 | 9/2012 |
| WO | 2015141325 A1 | 9/2015 |

OTHER PUBLICATIONS

International Search Report for International Patent Application No. PCT/JP2016/086642, issued by the Japan Patent Office dated Feb. 7, 2017.
Office Action issued for counterpart Chinese Application 201680039319.2, issued by the China National Intellectual Property Administration dated Sep. 27, 2019.

* cited by examiner

SEMICONDUCTOR DEVICE

The contents of the following Japanese patent applications are incorporated herein by reference:
NO. 2016-003699 filed in JP on Jan. 12, 2016, and
PCT/JP2016/086642 filed on Dec. 8, 2016.

BACKGROUND

1. Technical Field

The present invention relates to a semiconductor device.

2. Related Art

Semiconductor devices housing a semiconductor chip and the like have been conventionally known that include, in their structure, main terminals fixed to external bus bars or the like (see Patent Document 1, for example). The main terminals are arranged at predetermined positions of the front surface of a resin case.

Patent Document 1: Japanese Utility Model Application No. H5-15445

To facilitate assembling of such a semiconductor device, a clearance is provided between the resin case and the main terminals. For this reason, the relative positions of the main terminals to the resin case vary in, for example, the assembling of the semiconductor device.

SUMMARY

A first aspect of the present invention provides a semiconductor device. The semiconductor device includes a terminal portion and a casing portion. The terminal portion has a through hole in a principal surface portion. The casing portion has a depression at a position facing the through hole. The casing portion may have an end surface facing portion facing an end surface of the terminal portion. An end surface protruding portion may be provided on at least one of the end surface and the end surface facing portion.

The casing portion may have a bottom portion on which a semiconductor chip is mounted and to which the terminal portion is fixed. The casing portion may have a lid portion that covers at least a part of the bottom portion and in which an opening for allowing the principal surface portion of the terminal portion to be exposed is provided. The casing portion may have an insertion portion inserted, in the opening of the lid portion, between the principal surface portion of the terminal portion and the bottom portion and having the depression at the position facing the through hole of the terminal portion. The end surface facing portion may be provided, in an insertion direction of the insertion portion, on the lid portion facing the end surface of the terminal portion. The end surface protruding portion may have a tapered portion whose thickness gradually becomes larger as a distance to the bottom portion becomes longer.

The insertion portion may have a principal surface facing portion facing the principal surface portion of the terminal portion. A principal surface protruding portion may be provided on at least one of the principal surface portion and the principal surface facing portion. The device includes a plurality of the terminal portions and sets of at least three of the principal surface protruding portions. The sets may be respectively provided on the terminal portions.

The terminal portion may have a side surface portion coupled to the principal surface portion and sandwiched by a sidewall of the insertion portion and an inner wall of the lid portion. A side surface protruding portion may be provided on at least one of the side surface portion of the terminal portion and the sidewall of the insertion portion. The side surface protruding portion may have a tapered portion whose thickness gradually becomes larger in the insertion direction as a distance to the end surface facing portion of the lid portion becomes longer.

The terminal portion may further include a foot portion coupled to the side surface portion and fixed to the bottom portion of the casing portion. The casing portion may have a pressing portion that presses the foot portion toward the bottom portion of the casing portion. The principal surface protruding portion may be provided on the principal surface facing portion of the insertion portion and press the principal surface portion of the terminal portion in a direction away from the bottom portion of the casing portion.

The side surface protruding portion may be arranged, within a plane parallel to the side surface portion of the terminal portion, in a triangle formed by two of the principal surface protruding portions provided close to the side surface portion and a connection point of the pressing portion and the foot portion.

The device includes a plurality of the terminal portions and a plurality of the side surface protruding portions. The terminal portions may be aligned along the insertion direction. The side surface protruding portions may be respectively provided correspondingly to the terminal portions. A side surface groove portion fitted with the side surface protruding portion may be provided on one of the side surface portion of the terminal portion and the sidewall of the insertion portion correspondingly to one of the terminal portions that is provided nearest in the insertion direction.

The foot portion may have an extending portion extending in the insertion direction and a fixing portion provided extending from any of ends of the extending portion in the insertion direction toward the bottom portion of the casing portion and fixed to the bottom portion. The fixing portion of at least one of the terminal portions may be provided on the end of the extending portion closer to the end surface protruding portion. The fixing portion of at least one of the terminal portions may be provided on the end of the extending portion farther from the end surface protruding portion. A position of the principal surface protruding portion each of the terminal portions may be different depending on a position of the fixing portion.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
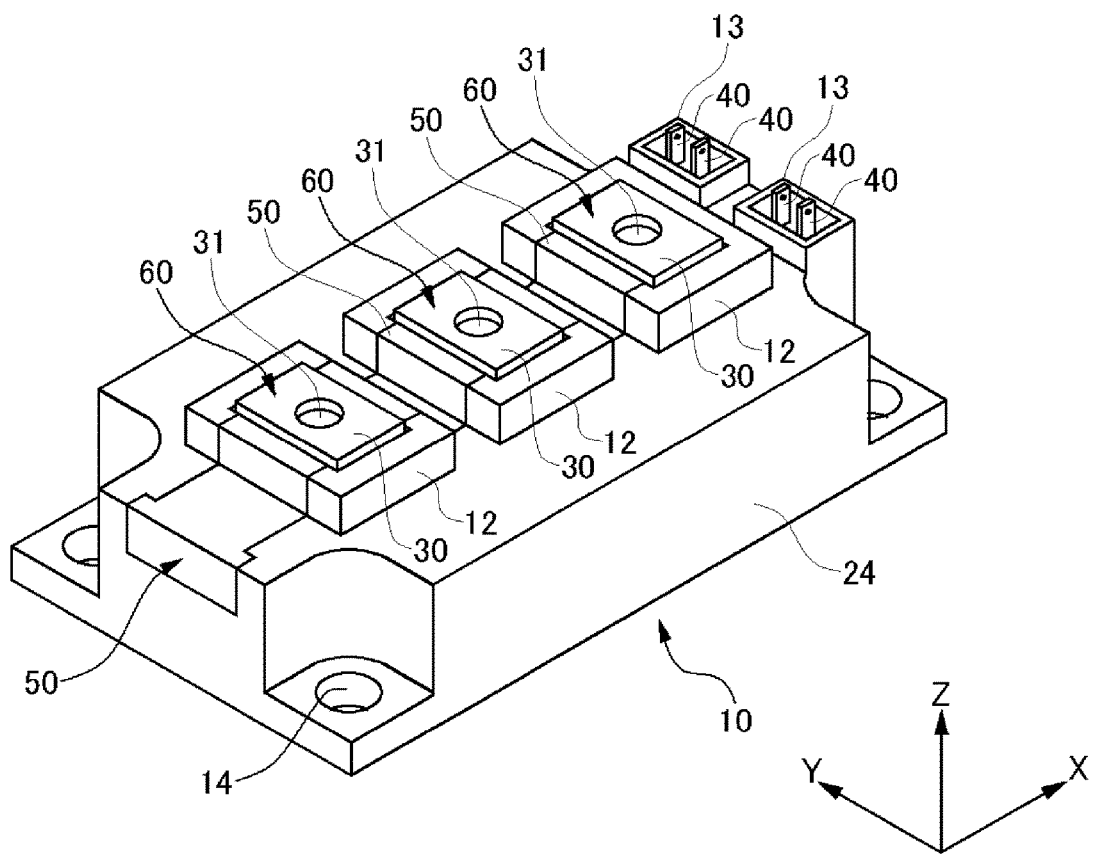
FIG. 1 is a perspective view schematically showing a semiconductor device 100 according to a first embodiment of the present invention.

FIG. 1 is a perspective view schematically showing a semiconductor device 100 according to a first embodiment of the present invention. The semiconductor device 100 houses therein an electronic circuit such as a semiconductor chip. The semiconductor device 100 in the present example includes a casing portion 10, a plurality of main terminals 60 and a plurality of control terminals 40. The main terminals 60 are an example of a terminal portion.

The casing portion 10 houses therein an electronic circuit such as a semiconductor chip. In an example, the casing portion 10 includes a bottom portion having a substrate on which the electronic circuit is mounted, a lid portion 24 and an insertion portion 50. The lid portion 24 is fixed to the bottom portion by adhesion or the like and covers at least a part of the bottom portion. An electronic circuit is mounted on the part of the bottom portion covered by the lid portion 24. The lid portion 24 is formed of an insulating material such as a resin. A through hole 14 such as a screw hole for fixing the semiconductor device 100 to an external component is provided at a corner of the lid portion 24.

Note that, in this specification, a plane parallel to the front surface of the casing portion 10 is defined as an X-Y plane. Also, a longitudinal direction and a lateral direction of the front surface of the casing portion 10 are respectively defined as an X-direction and a Y-direction. Note that the lateral direction may be the X-direction and the longitudinal direction may be the Y-direction. Also, a direction perpendicular to the X-Y plane is defined as a Z-direction. In this specification, the Z-direction is referred to as a height direction in some cases. Also, a direction from the bottom portion of the casing portion 10 toward the front surface of the lid portion 24 is referred to as an upward direction and a direction from the front surface of the lid portion 24 toward the bottom portion is referred to as a downward direction in some cases. Note that the upward and downward directions do not necessarily coincide with gravitational directions. Also, for each of the X, Y, and Z coordinate axes shown in each drawing, one side marked with an arrow and the opposite side are referred to as the plus side and the minus side, respectively.

The main terminal 60 is electrically connected to an electronic circuit covered by the lid portion 24. The main terminal 60 is formed of a conductive material. For example, each main terminal 60 forms a current path of a large current which flows in a power device such as an IGBT. At least a part of a principal surface portion 30 of the main terminal 60 is exposed at the front surface of the casing portion 10. The main terminal 60 in the present example has a plate shape.

The principal surface portion 30 of the main terminal 60 is exposed at the front surface of the lid portion 24 and has a plane substantially parallel to the front surface. A through hole 31 is formed in the principal surface portion 30 of the main terminal 60. When a screw or the like is inserted into the through hole 31, the semiconductor device 100 is thereby fixed to an external bus bar or the like.

The main terminal 60 further includes a side surface portion extending from the principal surface portion 30 toward the bottom portion of the casing portion 10. The side surface portion is electrically connected to an electronic circuit provided to the bottom portion of the casing portion 10.

An opening for exposing a part of the main terminal 60 is provided to the lid portion 24. The opening in the present example is a slit extending in the X-direction on the front surface of the lid portion 24 and exposes the principal surface portion 30 of the main terminal 60. The opening is provided at the Y-direction center of the front surface of the lid portion 24.

The insertion portion 50 is inserted into the opening, and provided facing the principal surface portion 30 of the main terminal 60. In the present example, the insertion portion 50 is arranged below the principal surface portion 30. In the insertion portion 50, a depression is provided at a position facing the through hole 31 of the principal surface portion 30. By providing a nut or the like to the depression, a screw or the like passing through the through hole 31 can be fastened to the depression.

The lid portion 24 includes a main terminal arrangement portion 12 on its front surface. The main terminal arrangement portion 12 is provided protruding in the upward direction from the front surface of the lid portion 24. The principal surface portion 30 of the main terminal 60 is exposed at the front surface of the main terminal arrangement portion 12. Note that the main terminal arrangement portion 12 is also provided with an opening for inserting thereinto the insertion portion 50.

The control terminal 40 has a linear shape whose width is smaller than that of the main terminal 60. One end of the control terminal 40 is exposed at the front surface of the lid portion 24. The other end of the control terminal 40 is electrically connected to an electronic circuit mounted on the bottom portion of the casing portion 10. The lid portion 24 includes a control terminal arrangement portion 13 surrounding portions of the control terminal 40 other than its tip.

Figure 2:
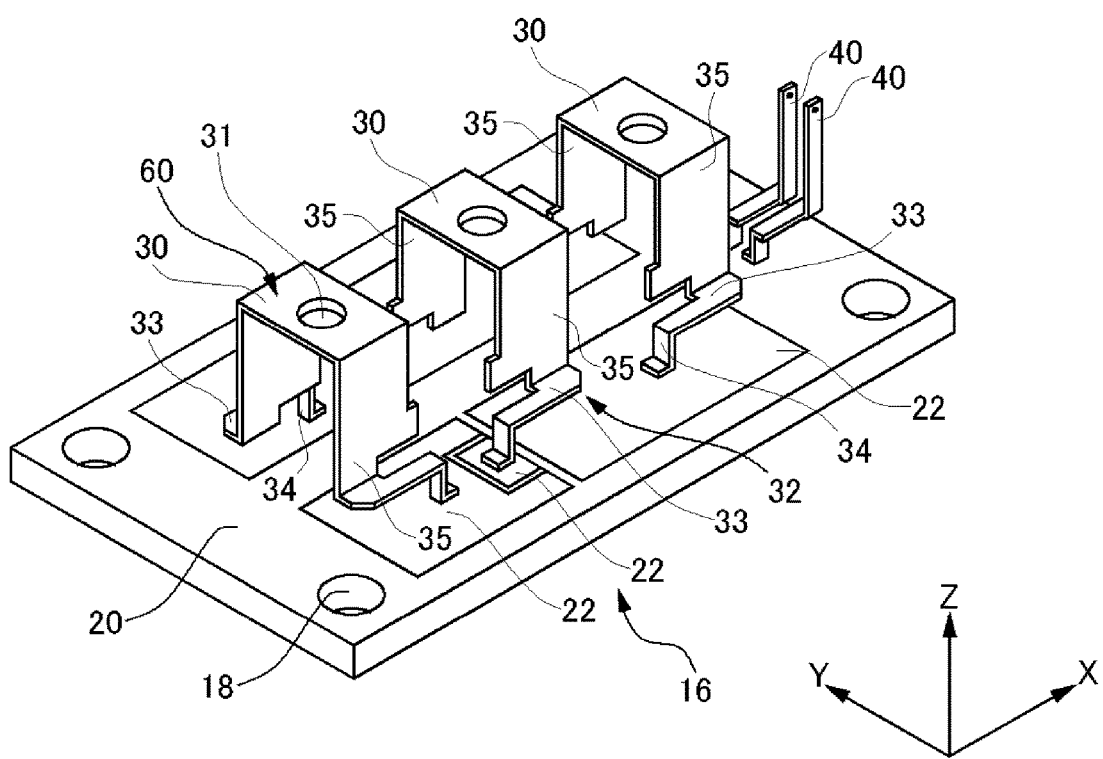
FIG. 2 is a perspective view schematically showing a bottom portion 16 of a casing portion 10, and main terminals 60.

FIG. 2 is a perspective view schematically showing the bottom portion 16 of the casing portion 10 and the main terminals 60. The bottom portion 16 includes a substrate 20 and an electronic circuit 22. The substrate 20 includes a metal plate such as a copper plate and an insulating layer covering the front surface of the metal plate. It may further include a metal layer on a side of the metal plate in the insulating layer. The electronic circuit 22 is provided on the insulating layer. The electronic circuit 22 may have a pad connected to the main terminal 60 and the control terminal 40. A through hole 18 for fixing the semiconductor device 100 to an external component is provided at a corner of the substrate 20. The through hole 18 may be arranged to have substantially the same axis as the through hole 14 of the casing portion 10.

The semiconductor device 100 may include a plurality of main terminals 60. In the example in FIG. 2, three main terminals 60 are aligned along a direction in which the insertion portion 50 is inserted (the X-direction in the present example). Each main terminal 60 includes a principal surface portion 30, a side surface portion 35 and a foot portion 32. The principal surface portion 30 is arranged in parallel with the X-Y plane.

The side surface portion 35 is provided extending from both Y-direction ends of the principal surface portion 30 toward the bottom portion 16. Each side surface portion 35 is arranged in parallel with the X-Z plane. The foot portion 32 is coupled to an end side of the side surface portion 35 closer to the bottom portion 16, and is connected to the bottom portion 16.

The foot portion 32 is flexible such that the main terminal 60 can be inclined in accordance with applied force. For example, the foot portion 32 supports the main terminal 60 such that it can be inclined in the X-Z plane. The foot portion 32 may also support the main terminal 60 such that it can further be inclined in the Y-Z plane.

The foot portion 32 in the present example includes an extending portion 33 and a fixing portion 34. The extending portion 33 is coupled to a part of an end side of the side surface portion 35 closer to the bottom portion 16, and is provided extending along the X-direction. In an example, the extending portion 33 is provided at an outer side of each side surface portion 35, and extends from one X-direction end of an end side of the side surface portion 35 closer to the bottom portion 16 toward the other X-direction end of the end side. The extending portion 33 has a shape of a plate parallel to the X-Y plane.

The fixing portion 34 is provided at, from among ends of the extending portion 33, an end at the opposite side to an end connected to the side surface portion 35. The fixing portion 34 is provided extending from the end of the extending portion 33 toward the bottom portion 16. The lower end of the fixing portion 34 is fixed to the electronic circuit 22 with a solder or the like.

Such a configuration allows the main terminal 60 to be inclined in the X-Z plane in accordance with applied force. The insertion portion 50 is inserted into a space sandwiched by two facing side surface portions 35 of each main terminal 60. The insertion portion 50 can be easily inserted as the main terminal 60 is inclined in accordance with variation in a position at which the insertion portion 50 is inserted or the like. The foot portion 32 may be provided at each side surface portion 35.

Figure 3:
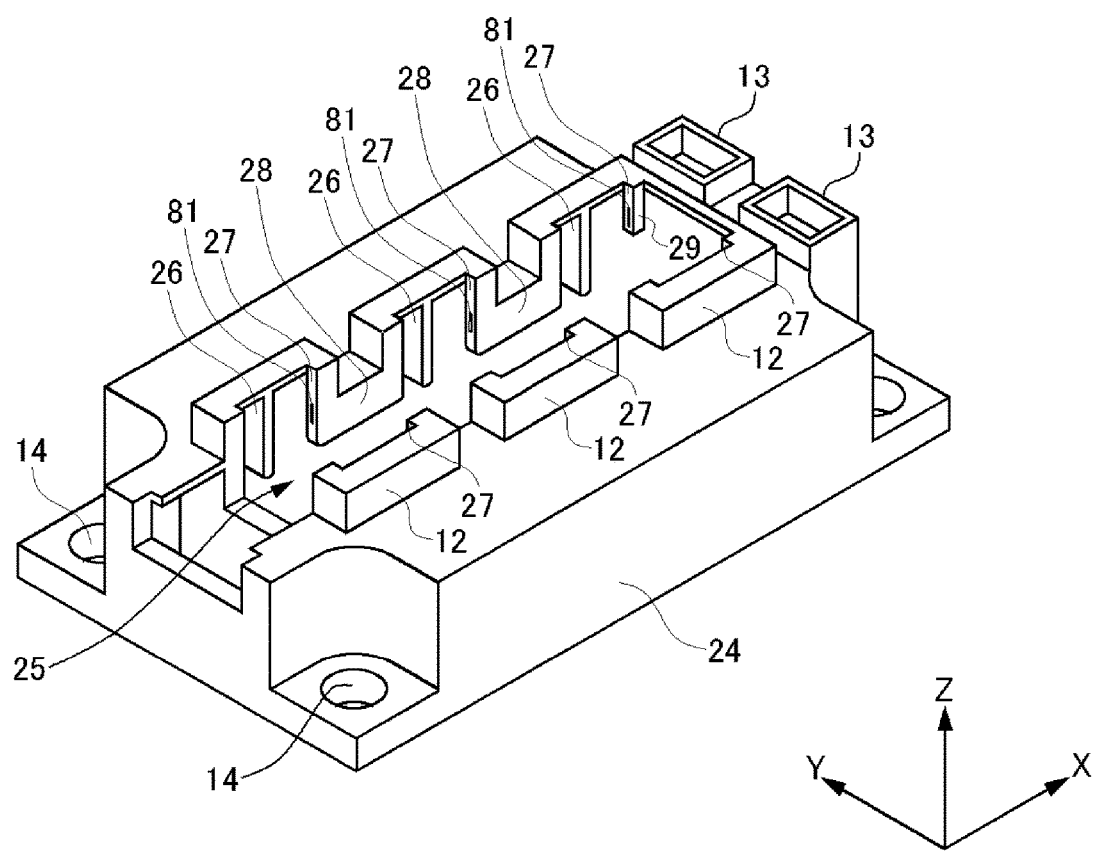
FIG. 3 is a perspective view schematically showing a lid portion 24.

FIG. 3 is a perspective view schematically showing the lid portion 24. The lid portion 24 includes, in addition to the configuration shown in FIG. 1, an opening 25 at its front surface. The opening 25 is formed extending from one X-direction end of the front surface of the lid portion 24 toward the other end.

On the front surface of the lid portion 24, the main terminal arrangement portion 12 is provided at both Y-direction sides of the opening 25. The main terminal arrangement portion 12 is provided at a position corresponding to each main terminal 60. The main terminal 60 is exposed at the opening of its corresponding main terminal arrangement portion 12. The lid portion 24 is assembled to the bottom portion 16 such that the lid portion 24 is put on the bottom portion 16 from above in the Z-direction. At this time, each main terminal 60 is inserted into the opening of the main terminal arrangement portion 12 along a sidewall of the opening. Also, the control terminal 40 is inserted into the opening of the control terminal arrangement portion 13 along the sidewall of the opening.

Each main terminal arrangement portion 12 includes a ceiling portion which is parallel to the X-Y plane. Also, the lid portion 24 includes a pressing portion 26 extending from the ceiling portion toward the bottom portion 16. When the main terminal 60 is inserted into the opening of the main terminal arrangement portion 12, the pressing portion 26 is arranged along the side surface portion 35 of the main terminal 60. The pressing portion 26 may be arranged at the X-direction center of the side surface portion 35.

The lower end of the pressing portion 26 abuts on the front surface of the extending portion 33 at the foot portion 32 of the main terminal 60. In this manner, the extending portion 33 is pressed toward the substrate 20 at the bottom portion 16, and a position of the extending portion 33 in the upward and downward directions can be defined.

Also, a joint portion 28 is provided between each two main terminal arrangement portions 12 adjacent to each other in the X-direction. The thickness of the joint portion 28 in the Z-direction is larger than the thickness of the ceiling portion of the main terminal arrangement portion 12. The joint portion 28 has an end surface facing portion 27 exposed at the opening 25. The end surface facing portion 27 has a surface facing the end surface of the main terminal 60. In the present example, the end surface of the main terminal 60 refers to a surface along the direction of the thickness of the terminal with the plate shape. The end surface facing portion 27 shown in FIG. 3 faces the end surface of the side surface portion 35 of the main terminal 60. In the present example, the end surface facing portion 27 and the end surface of the main terminal 60 are parallel to the Y-Z plane. The end surface facing portion 27 is longitudinal in the Z-direction.

Note that one of the main terminal arrangement portions 12 that is arranged on the farthest side in the X-direction is provided with a terminal end portion 29 instead of the joint portion 28. Similarly to the joint portion 28, the terminal end portion 29 also has an end surface facing portion 27 exposed at the opening 25.

Each end surface facing portion 27 is provided with an end surface protruding portion 81. The end surface protruding portion 81 has a predetermined thickness in the X-direction. The end surface protruding portion 81 may be molded of the same material as that of the lid portion 24 and integrally with the lid portion 24. Providing the end surface protruding portion 81 allows the position of the main terminal 60 in the X-direction to be accurately defined relative to the end surface facing portion 27.

Figure 4:
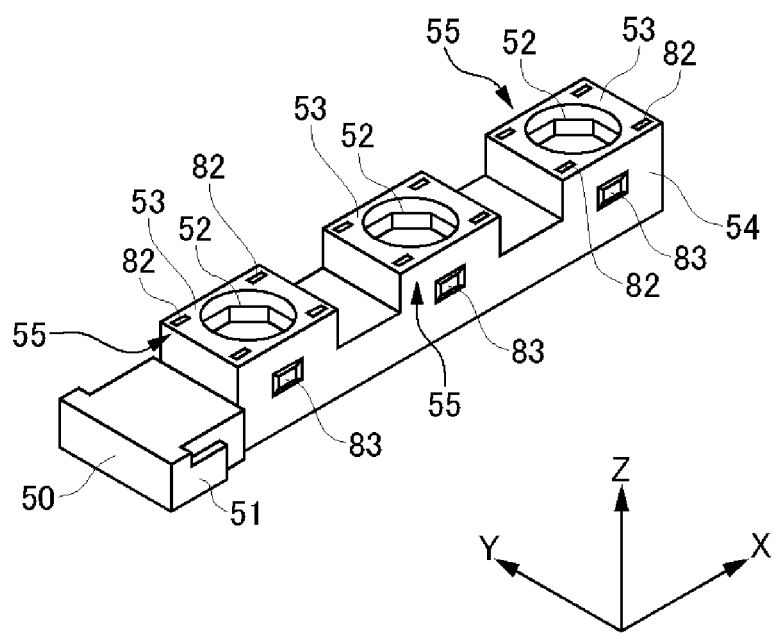
FIG. 4 is a perspective view schematically showing an insertion portion 50.

FIG. 4 is a perspective view schematically showing the insertion portion 50. The insertion portion 50 has the same width in the Y-direction and the same length in the X-direction as the opening 25 provided to the front surface of the lid portion 24. The insertion portion 50 is inserted into the opening 25 along the X-direction. The insertion portion 50 is inserted between the principal surface portion 30 of the main terminal 60 and the bottom portion 16.

The insertion portion 50 includes a principal surface facing portion 55 facing the principal surface portion 30 of each main terminal 60. Each principal surface facing portion 55 protrudes in the Z-direction from the front surface of the insertion portion 50. A depression 52 and a plurality of principal surface protruding portions 82 are provided to a front surface 53 of each principal surface facing portion 55.

The depression 52 is provided at a position facing the through hole 31 of the main terminal 60. In an example, the depression 52 is provided at the center of the front surface 53 of the principal surface facing portion 55. The depression 52 may have a greater diameter than that of the through hole 31. A nut or the like is arranged inside the depression 52. A screw or the like passing through the through hole 31 is fastened to the nut or the like inside the depression 52.

Fastening the screw or the like causes the principal surface portion 30 of the main terminal 60 to be pressed against the principal surface facing portion 55. On the other hand, the principal surface protruding portion 82 presses the principal surface portion 30 from below. Such a configuration allows the position of the principal surface portion 30 in the Z-direction to be accurately defined.

The principal surface protruding portions 82 are provided around the depression 52 on the front surface 53. Sets of at least three of the principal surface protruding portions 82 may be respectively provided on the main terminals 60. The principal surface protruding portion 82 has a thickness in the Z-direction. The principal surface protruding portion 82 may be molded of the same material as that of the insertion portion 50 and integrally with the insertion portion 50. On the front surface 53 of the principal surface facing portion 55, the plurality of principal surface protruding portions 82 may be provided. When the front surface 53 of the principal surface facing portion 55 is in a polygonal shape, the principal surface protruding portion 82 may be provided between the depression 52 and each corner of the front surface 53.

Also, the insertion portion 50 has a side surface protruding portion 83 correspondingly to at least one main terminal 60. In the example in FIG. 4, sets of the side surface protruding portions 83 are respectively provided to all the main terminals 60. Also, the sets of the side surface protruding portions 83 are respectively provided on the side surface portions 35 of the main terminals 60. The side surface protruding portion 83 has a thickness in the Y-direction. The side surface protruding portion 83 may be molded of the same material as that of the insertion portion 50 and integrally with the insertion portion 50.

The side surface protruding portion 83 is provided on the sidewall 54 of the insertion portion 50 parallel to the X-Z plane and at a position facing the side surface portion 35 of the main terminal 60. The side surface protruding portions 83 may be provided on two sidewalls 54 on both sides of the insertion portion 50. The side surface portion 35 of the main terminal 60 is sandwiched by the side surface protruding portion 83 and the inner wall of the pressing portion 26 that is shown in FIG. 3. Providing the side surface protruding portions 83 allows the positions of the side surface portions 35 of the main terminals 60 in the Y-direction to be accurately defined.

The width of the side surface protruding portion 83 in the X-direction is larger than the width of the pressing portion 26 in the X-direction. For example, the width of the side surface protruding portion 83 is twice or more of the width of the pressing portion 26.

The insertion portion 50 may also include a locking portion 51 which is fitted with the lid portion 24 to fix the insertion portion 50 to the lid portion 24. For example, the locking portion 51 may be provided at one end of the insertion portion 50 that is inserted into the opening 25 posterior to the other end. The locking portion 51 in the present example protrudes in the Y-direction. The locking portion 51 is fitted with a depression provided to the lid portion 24. The insertion portion 50 may also be fixed to the lid portion 24 with an adhesive or the like when inserted into the opening 25.

Figure 5:
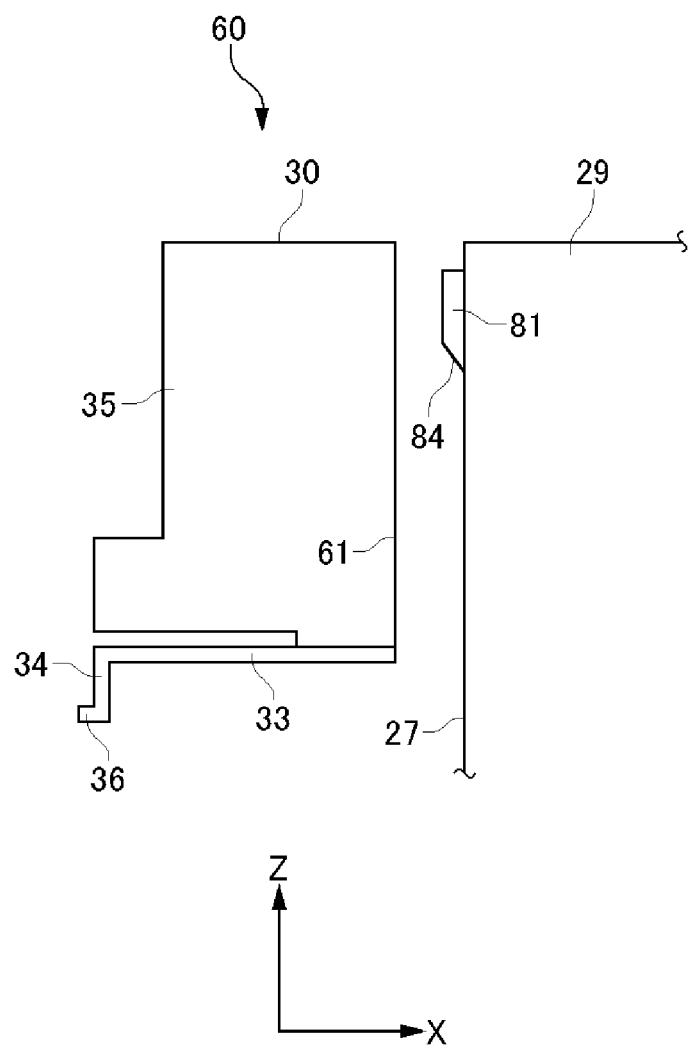
FIG. 5 is an enlarged side view of the main terminal 60 and an end surface facing portion 27.

FIG. 5 is an enlarged side view of the main terminal 60 and the end surface facing portion 27. FIG. 5 shows the X-Z plane. As described in FIG. 3, the end surface protruding portion 81 is provided on the end surface facing portion 27 facing the end surface 61 of the main terminal 60. The end surface facing portion 27 has one of surfaces parallel to the Y-Z plane that is directed opposite to the insertion direction of the insertion portion 50 (i.e., the minus direction of the X-axis). That is, the end surface facing portion 27 and the end surface 61 of the main terminal 60 face each other in the insertion direction of the insertion portion 50. Note that although FIG. 5 shows the end surface 61 of the main terminal 60 and the end surface protruding portion 81 separated from each other, the end surface 61 and the end surface protruding portion 81 contact each other after the lid portion 24 is fixed to the bottom portion 16.

The end surface protruding portion 81 has a tapered portion 84 whose thickness gradually becomes larger as a distance to the bottom portion 16 becomes longer. The tapered portion 84 is formed on the end closer to the bottom portion 16 of the end surface protruding portion 81. This allows the main terminal 60 to be smoothly inserted into the opening 25 along the tapered portion 84 when the lid portion 24 is put on the bottom portion 16 from thereabove. The end surface protruding portion 81 may have a constant thickness in its regions other than the tapered portion 84. That is, the end surface protruding portion 81 has a surface parallel to the Y-Z plane.

The end surface protruding portion 81 may be formed on an upper side relative to the center of the side surface portion 35 of the main terminal 60 in the Z-direction. The end surface protruding portion 81 may be formed at a position facing the upper end of the side surface portion 35. The main terminal 60 in the present example is fixed to the bottom portion 16 at a tip 36 of the fixing portion 34. Since the extending portion 33 and the like are flexible, the upper end of the main terminal 60 is movable in the widest range in the X-direction. Arranging the end surface protruding portion 81 such that the same faces the upper half part of the main terminal 60 allows the position of the main terminal 60 in the X-direction to be accurately defined.

Although the present example shows an example in which the end surface protruding portion 81 is provided on the end surface facing portion 27, the end surface protruding portion 81 may be provided on the end surface 61 of the main terminal 60. The end surface protruding portion 81 may be provided on at least one of the end surface 61 and the end surface facing portion 27. When the end surface protruding portion 81 is provided on both the end surface 61 and the end surface facing portion 27, the two end surface protruding portions 81 may be provided facing each other. In this case, the end surface protruding portion 81 provided on the end surface facing portion 27 may have a width in the Z-direction that is larger than that of the end surface protruding portion 81 provided on the end surface 61.

Figure 6:
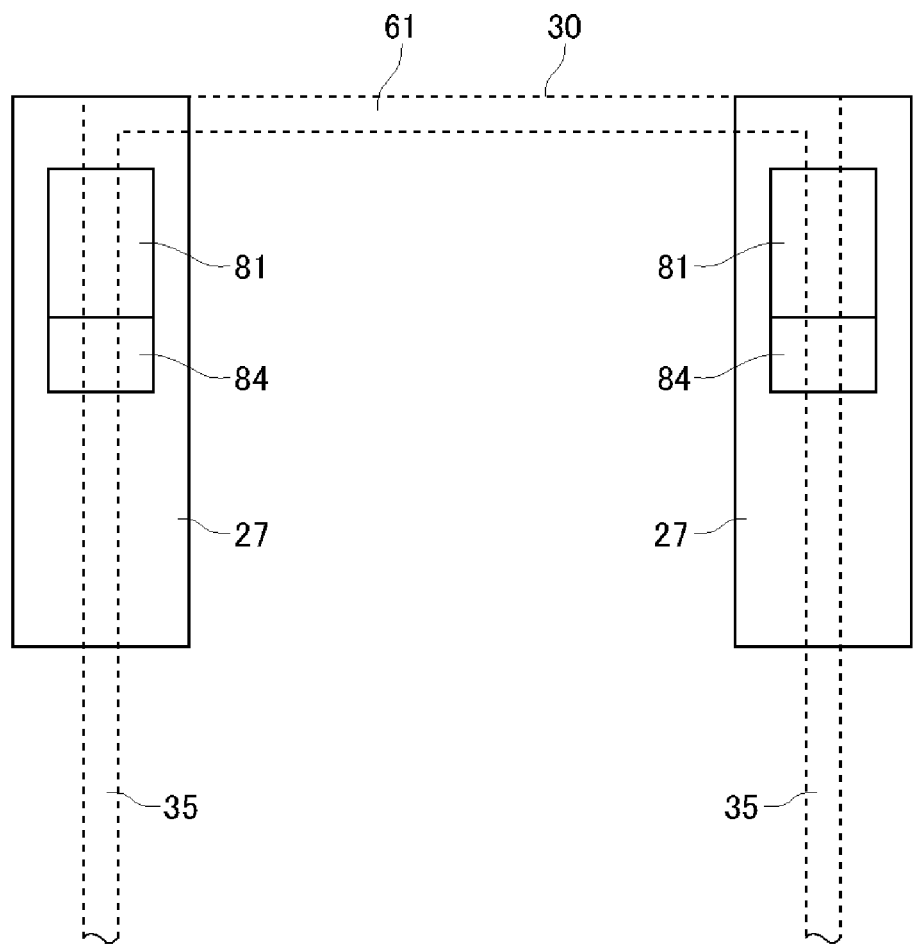
FIG. 6 is a schematic view showing the positions of the end surface facing portions 27 and an end surface 61 in the Z-Y plane.

FIG. 6 is a schematic view showing the positions of the end surface facing portions 27 and the end surface 61 in the Z-Y plane. FIG. 6 schematically shows the end surface facing portion 27 and the like. Their relative size thus does not coincide with that of the end surface facing portion 27 and the like shown in FIGS. 1 to 5. Also, in FIG. 6, the outer shape of the end surface 61 is indicated by dashed lines.

The end surface protruding portion 81 is provided so as to overlap with the end surface 61 on the side surface portion 35 of the main terminal 60 in the Y-Z plane. The width in the Y-direction of the end surface protruding portion 81 is larger than the width of the end surface 61. For example, the end surface protruding portion 81 has a width in the Y-direction which is twice or more of that of the end surface 61. This allows the end surface protruding portion 81 and the end surface 61 to contact each other even when the position of the end surface 61 is shifted in the Y-direction.

Figure 7:
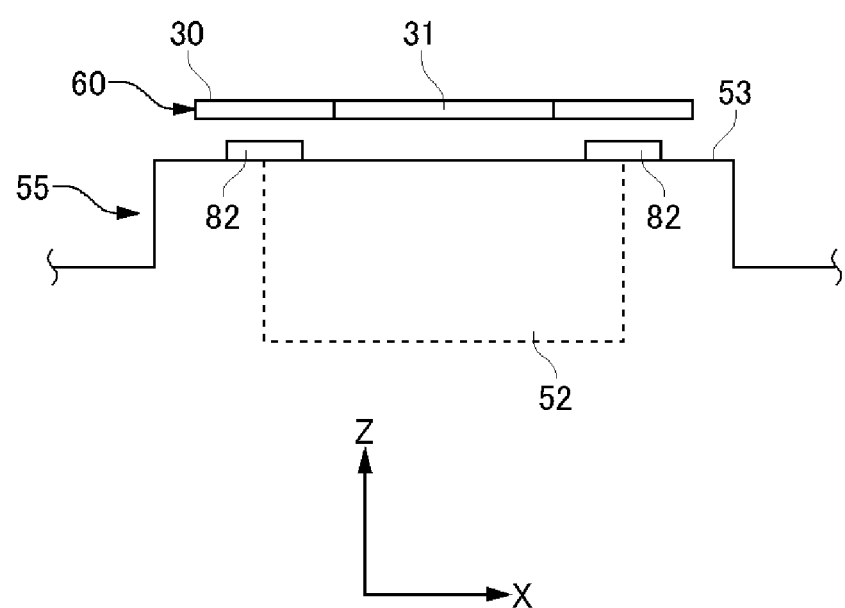
FIG. 7 is an enlarged side view of a principal surface facing portion 55, and a principal surface portion 30 of the main terminal 60.

FIG. 7 is an enlarged side view of the principal surface facing portion 55 and the principal surface portion 30 of the main terminal 60. FIG. 7 shows the X-Z plane. Note that the side surface portion 35 of the main terminal 60 is omitted in FIG. 7. As described in FIG. 4, the principal surface protruding portion 82 is provided on the front surface 53 of the principal surface facing portion 55 facing the principal surface portion 30 of the main terminal 60. The principal surface protruding portion 82 may have a constant thickness in the Z-direction. Note that although FIG. 7 shows the principal surface portion 30 of the main terminal 60 and the principal surface protruding portion 82 separated from each other, the principal surface portion 30 and the principal surface protruding portion 82 contact each other after the screw or the like is inserted into the depression 52 and the through hole 31 and then fastened.

Although the present example shows an example in which the principal surface protruding portion 82 is provided on the principal surface facing portion 55, the principal surface protruding portion 82 may be provided on the lower surface of the principal surface portion 30 of the main terminal 60. The principal surface protruding portion 82 may be provided on at least one of the principal surface portion 30 and the principal surface facing portion 55. When the principal surface protruding portion 82 is provided on both the principal surface portion 30 and the principal surface facing portion 55, the two principal surface protruding portions 82 may be provided facing each other. In this case, the principal surface protruding portion 82 provided on the principal surface facing portion 55 may be larger than the principal surface protruding portion 82 provided on the principal surface portion 30.

Figure 8:
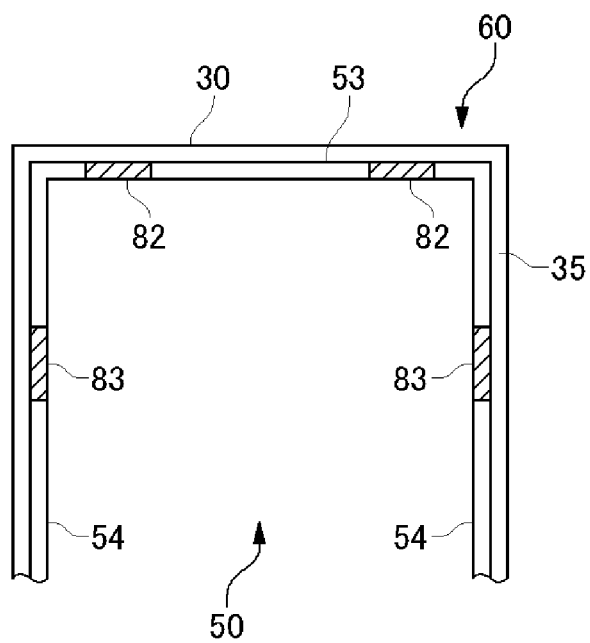
FIG. 8 is a schematic view showing a cross section of the insertion portion 50 and the main terminal 60 that is taken along the Y-Z plane.
Figure 8:
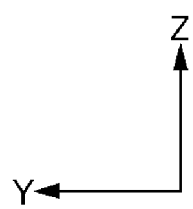

FIG. 8 is a schematic view showing the cross section of the insertion portion 50 and the main terminal 60 that is taken along the Y-Z plane. In FIG. 8, the through hole 31 and the depression 52 are omitted. The central part of the principal surface portion 30 is pressed toward the front surface 53 side of the insertion portion 50 by the screw or the like. On the other hand, the edge part of the principal surface portion 30 is pressed upward by the plurality of principal surface protruding portions 82. This allows the position of the principal surface portion 30 in the Z-direction to be accurately defined.

The side surface portions 35 of the main terminal 60 are coupled to the principal surface portion 30. The side surface portions 35 are sandwiched by the sidewall 54 of the insertion portion 50 and the inner wall (the pressing portion 26 in the example shown in FIG. 3) of the lid portion 24. The side surface portion 35 is pressed against the inner wall of the lid portion 24 by the side surface protruding portion 83. This allows the positions of the side surface portion 35 in the Y-direction to be accurately defined.

Note that each main terminal 60 is pressed in the insertion direction of the insertion portion 50 (the plus direction of the X-axis in the present example) by friction with the side surface protruding portion 83 in response to the insertion of the insertion portion 50. That is, as shown in FIG. 5, the end surface 61 of the main terminal 60 is pressed toward the end surface facing portion 27 side. For this reason, the insertion of the insertion portion 50 causes the main terminals 60 to be pressed against the end surface protruding portion 81 and thereby moved to predetermined positions even when the position of the main terminal 60 in the X-direction vary.

Consequently, even after the insertion of the insertion portion 50 is finished, the side surface protruding portion 83 keeps pressing the side surface portion 35 of the main terminal 60 against the inner wall of the lid portion 24. For this reason, the insertion portion 50 is fixed, and the main terminal 60 is thereby kept pressed against the end surface facing portion 27. This allows the position of the main terminal 60 in the X-direction to be accurately defined.

Figure 9:
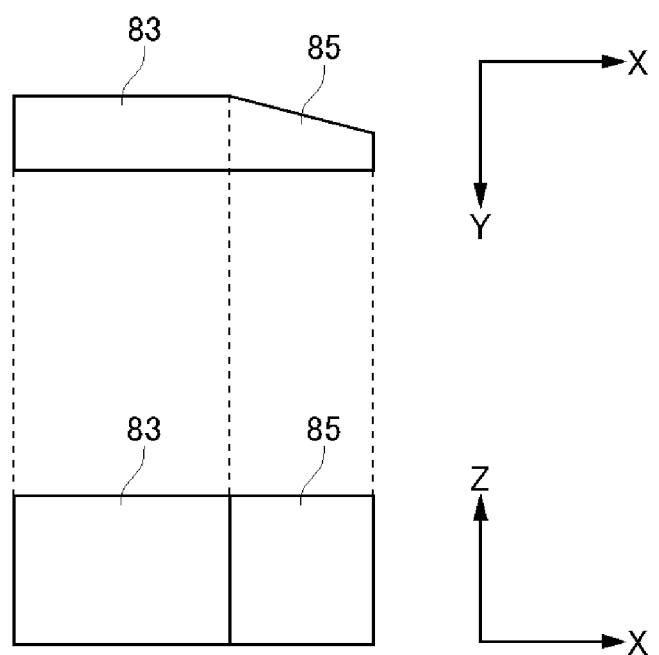
FIG. 9 is a diagram showing the shapes of a side surface protruding portion 83 in the X-Y plane and the X-Z plane.

FIG. 9 is a diagram showing the shapes of the side surface protruding portion 83 in the X-Y plane and the X-Z plane. As shown in FIG. 9, the side surface protruding portion 83 has, in the insertion direction of the insertion portion 50, a tapered portion 85 whose thickness in the Y-direction gradually becomes larger as a distance to the end surface facing portion 27 of the lid portion 24 becomes longer. The thickness of the side surface protruding portion 83 may be constant in regions other than the tapered portion 85. When the side surface protruding portion 83 is provided on the insertion portion 50, the tapered portion 85 is provided on the end on the end surface facing portion 27 side (in the present example, the plus direction side of the X-axis, that is, the far side in the insertion direction of the insertion portion 50) of the side surface protruding portion 83.

Note that similarly the principal surface protruding portion 82 may also have the tapered portion. When the principal surface protruding portion 82 is provided on the insertion portion 50, the tapered portion is provided on the end on the end surface facing portion 27 side of the principal surface protruding portion 82.

Figure 10:
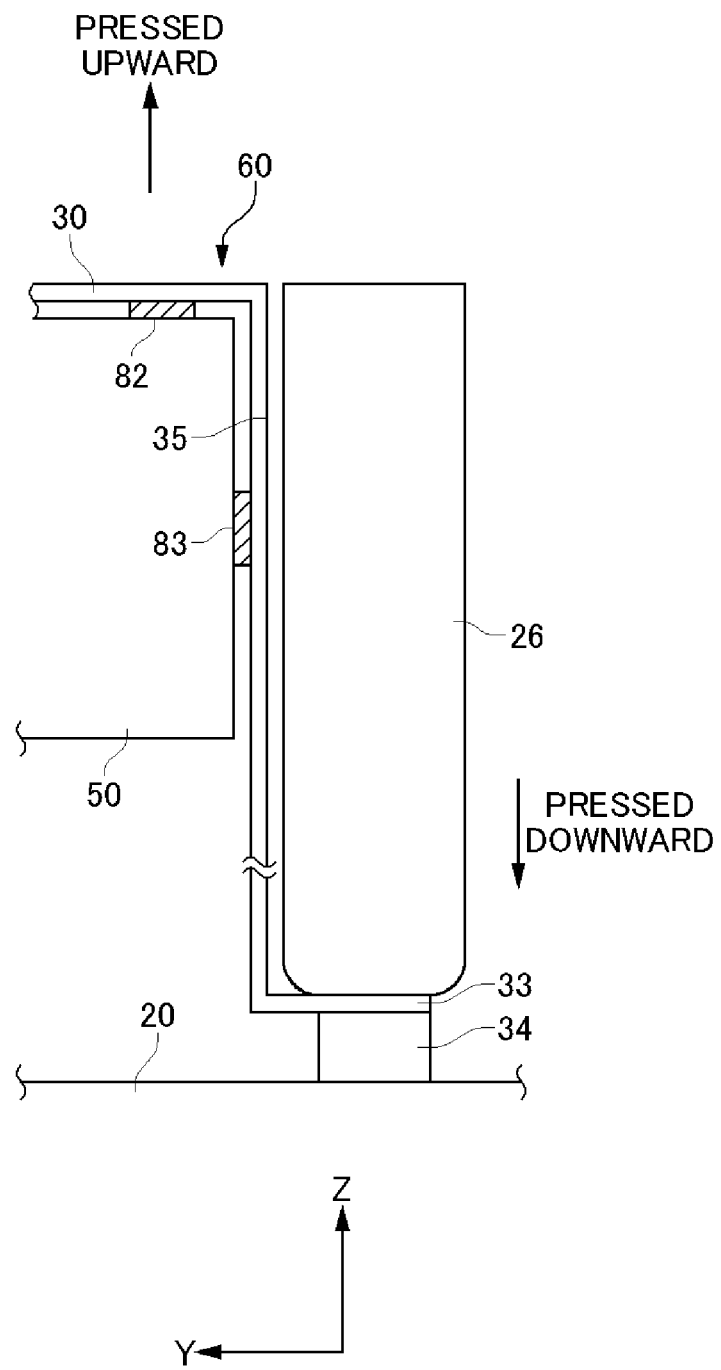
FIG. 10 is a diagram showing the main terminal 60 and a pressing portion 26 in the Y-Z plane.

FIG. 10 is a diagram showing the main terminal 60 and the pressing portion 26 in the Y-Z plane. As described above, the pressing portion 26 is provided extending downward from the ceiling portion of the lid portion 24. The lower end of the pressing portion 26 abuts the extending portion 33 of the main terminal 60.

The pressing portion 26 thereby presses the foot portion 32 of the main terminal 60 in the direction toward the bottom portion 16. Also, the principal surface protruding portion 82 presses the end of the principal surface portion 30 of the main terminal 60 in the direction away from the bottom portion 16. For this reason, the foot portion 32 side of the side surface portion 35 is pulled downward, and the principal surface portion 30 side of the side surface portion 35 is pulled upward. In this state, the side surface protruding portion 83 presses the side surface portion 35 against the end surface of the pressing portion 26. This allows the positions of the side surface portion 35 in the Z-direction and the Y-direction to be accurately defined.

Figure 11:
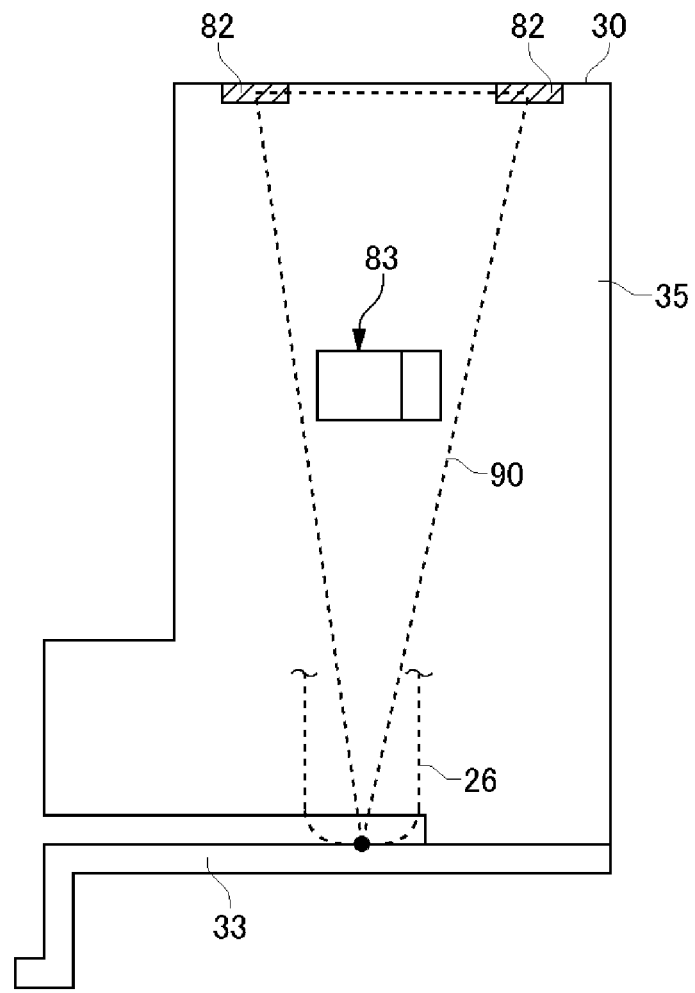
FIG. 11 is a diagram for explaining the position of the side surface protruding portion 83.

FIG. 11 is a drawing for explaining the position of the side surface protruding portion 83. FIG. 11 shows the side surface portion 35 of the main terminal 60 in the X-Z plane. Also, two principal surface protruding portions 82 close to the side surface portion 35 are provided facing the principal surface portion 30 of the main terminal 60. In FIG. 11, the insertion portion 50 is omitted, and the principal surface protruding portions 82 overlapping with the side surface portion 35 are shown. Here, the two principal surface protruding portions 82 close to the side surface portion 35 refer to two of the plurality of principal surface protruding portions 82 provided facing the principal surface portion 30 that are the closest to the side surface portion 35.

The side surface protruding portion 83 is arranged, in the X-Z plane parallel to the side surface portion 35, in a triangle 90 formed by the two principal surface protruding portions 82 provided close to the side surface portion 35 and the connection point of the pressing portion 26 and the extending portion 33. Two vertices of the triangle 90 that correspond to the two principal surface protruding portions 82 are the center of the principal surface protruding portions 82 in the X-Z plane.

The side surface protruding portion 83 may be arranged such that the center thereof in the X-Z plane is inside the triangle 90. A part of the side surface protruding portion 83 may be arranged outside of the triangle 90. For example, a region of the side surface protruding portion 83 whose thickness in the Y-direction is constant may be wholly arranged in the triangle 90, and a part of the tapered portion 85 may be arranged outside of the triangle 90. Also, the entire side surface protruding portion 83 may be arranged in the triangle 90.

The region bounded by the triangle 90 is pulled in upward and downward directions by the pressing portion 26 and the two principal surface protruding portions 82. For this reason, the side surface portion 35 in the region has a small distortion. Providing the side surface protruding portion 83 in the region allows the position of the side surface portion 35 in the Y-direction to be more accurately defined.

Figure 12:
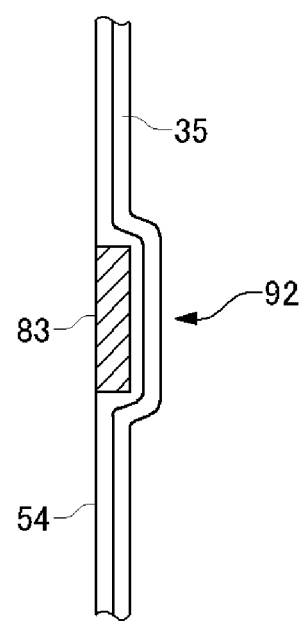
FIG. 12 is a diagram showing an example of the structure of a side surface portion 35.

FIG. 12 is a diagram showing an example of the structure of the side surface portion 35. FIG. 12 shows the side surface portion 35 of the main terminal 60 arranged on the nearest side in the insertion direction (i.e., the most minus side in the X-direction).

The side surface portion 35 has a side surface groove portion 92 at a position facing the side surface protruding portion 83. The side surface groove portion 92 has substantially the same shape as that of the side surface protruding portion 83. Note that the depth of the side surface groove portion 92 is smaller than the thickness of the side surface protruding portion 83.

Thereby, the side surface protruding portion 83 is fitted with the side surface groove portion 92, with the insertion portion 50 being inserted into the opening 25. This allows the insertion portion 50 to be prevented from falling off from the opening 25. Note that when the side surface protruding portion 83 is provided on the side surface portion 35, the side surface groove portion 92 is provided on the sidewall 54 of the insertion portion 50.

Figure 13:
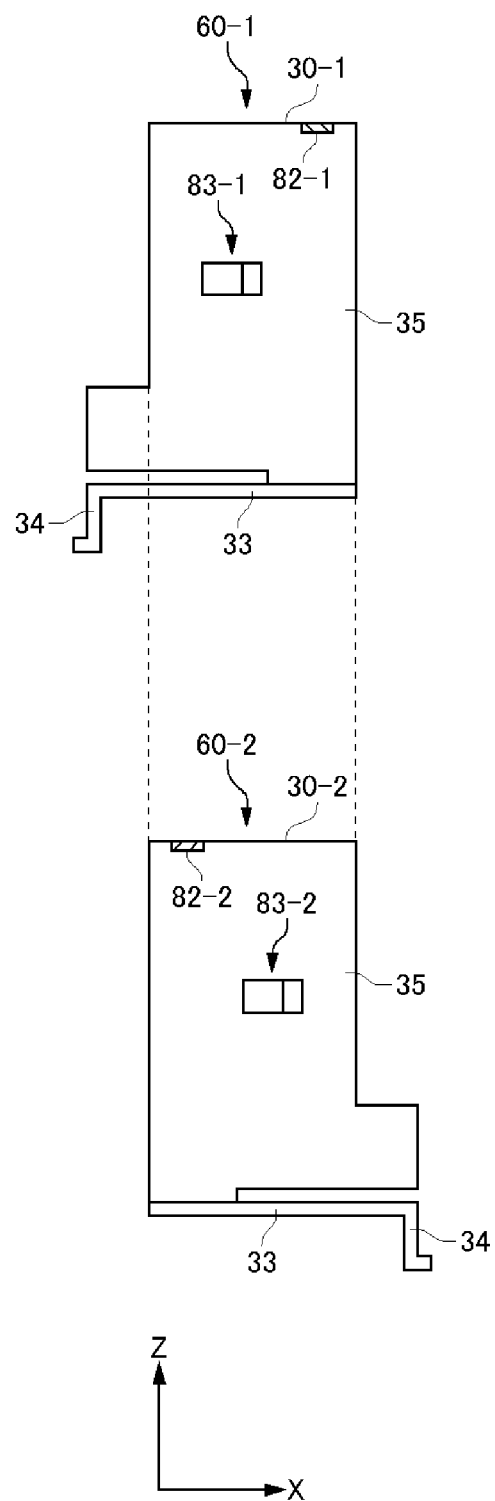
FIG. 13 is a diagram showing a variation of the position where the side surface protruding portion 83 is provided.

FIG. 13 is a diagram showing a variation of the position where the side surface protruding portion 83 is provided. In FIG. 13, the insertion portion 50 is omitted, and the side surface protruding portion 83 and the principal surface protruding portions 82 provided on the insertion portion 50 are shown with them overlapping with the side surface portion 35.

As shown in FIG. 2, at least one main terminal 60 may be provided in the X-direction in an orientation inverse to that of the other main terminals 60. That is, the fixing portion 34 of at least one main terminal 60-1 is provided on the end of the extending portion 33 on the near side in the insertion direction (the minus side in the X-direction). Also, the fixing portion 34 of at least one main terminal 60-2 is provided on the end of the extending portion 33 on the far side in the insertion direction (the plus side in the X-direction).

The main terminal 60 is rotated about the fixing portion 34 in response to a pressing force from the principal surface protruding portion 82. In the present example, the position of the principal surface protruding portion 82 on the principal surface portion 30 may be different depending on the position of the fixing portion 34. For example, each main terminal 60 may be provided with the principal surface protruding portion 82 on the side away from the fixing portion 34 relative to the center of the principal surface portion 30 in the X-direction. No principal surface protruding portion 82 is provided on the fixing portion 34 side of the principal surface portion 30 relative to the center of the fixing portion 34 side in the X-direction. That is, the main terminal 60 on which the fixing portion 34 is provided on the far side in the insertion direction is provided with the principal surface protruding portion 82 in the near side in the insertion direction. Also, the main terminal 60 on which the fixing portion 34 is provided on the near side in the insertion direction is provided with the principal surface protruding portion 82 on the far side in the insertion direction.

Providing the principal surface protruding portion 82 at a position away from the fixing portion 34 allows the position of the part of the main terminal 60 that is movable in the widest range to be defined. For this reason, the position of the main terminal 60 can be accurately defined.

Also, each main terminal 60 may be provided with the principal surface protruding portion 82 only on the fixing portion 34 side relative to the center of the principal surface portion 30 in the X-direction. In this case, the position of the main terminal 60 can be defined with the principal surface protruding portion 82 whose thickness is small.

Also, in each main terminal 60, the position of the side surface protruding portion 83 on the side surface portion 35 may be different depending on the position of the fixing portion 34. For example, the side surface protruding portion 83 may be provided on the fixing portion 34 side relative to the center of the side surface portion 35 in the X-direction or may be provided on the side away from the fixing portion 34.

The semiconductor device 100 described above allows the main terminal 60 to be pushed onto the casing portion 10 in the X-, Y- and Z-directions, thereby allowing the position of the main terminal 60 to be highly accurately defined. Also, the position of the main terminal 60 can be kept remained even when an external force is applied to the main terminal 60. For this reason, applied force from the main terminal 60 to the bottom portion 16 can be reduced, and the strength against the external force can be improved. For example, the strength against compression and tensile stress that are caused when the principal surface portion 30 of the main terminal 60 is fastened to the principal surface facing portion 55 by the screw or the like can be improved. Also, although the semiconductor device 100 includes the end surface protruding portion 81, the principal surface protruding portion 82, and the side surface protruding portion 83, the semiconductor device 100 may include, in other examples, only any one or two of the end surface protruding portion 81, the principal surface protruding portion 82, and the side surface protruding portion 83.

Figure 14:
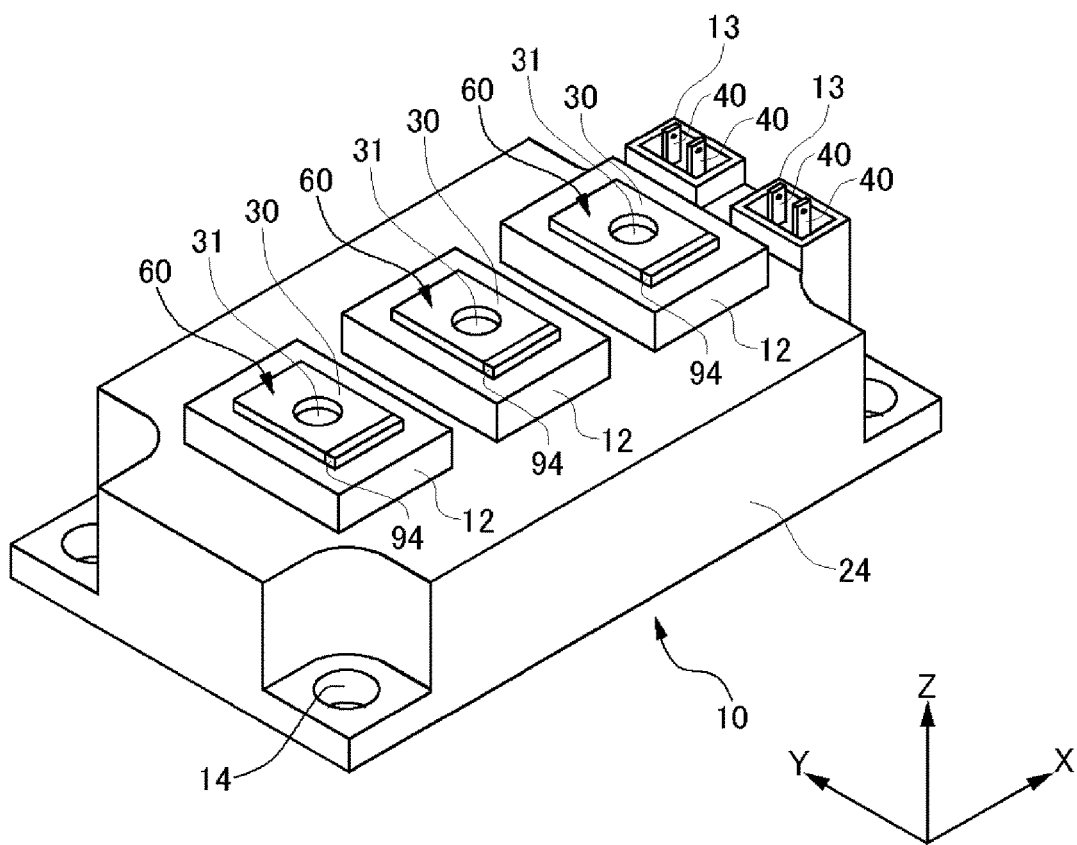
FIG. 14 is a perspective view schematically showing a semiconductor device 200 according to a second embodiment.

FIG. 14 is a perspective view schematically showing a semiconductor device 200 according to a second embodiment. The configuration of the semiconductor device 200 is different from the configuration of the semiconductor device 100 in that the semiconductor device 200 does not include the opening 25 and the insertion portion 50. The semiconductor device 200 may have the same configuration as that of the semiconductor device 100 in other respects.

Figure 15:
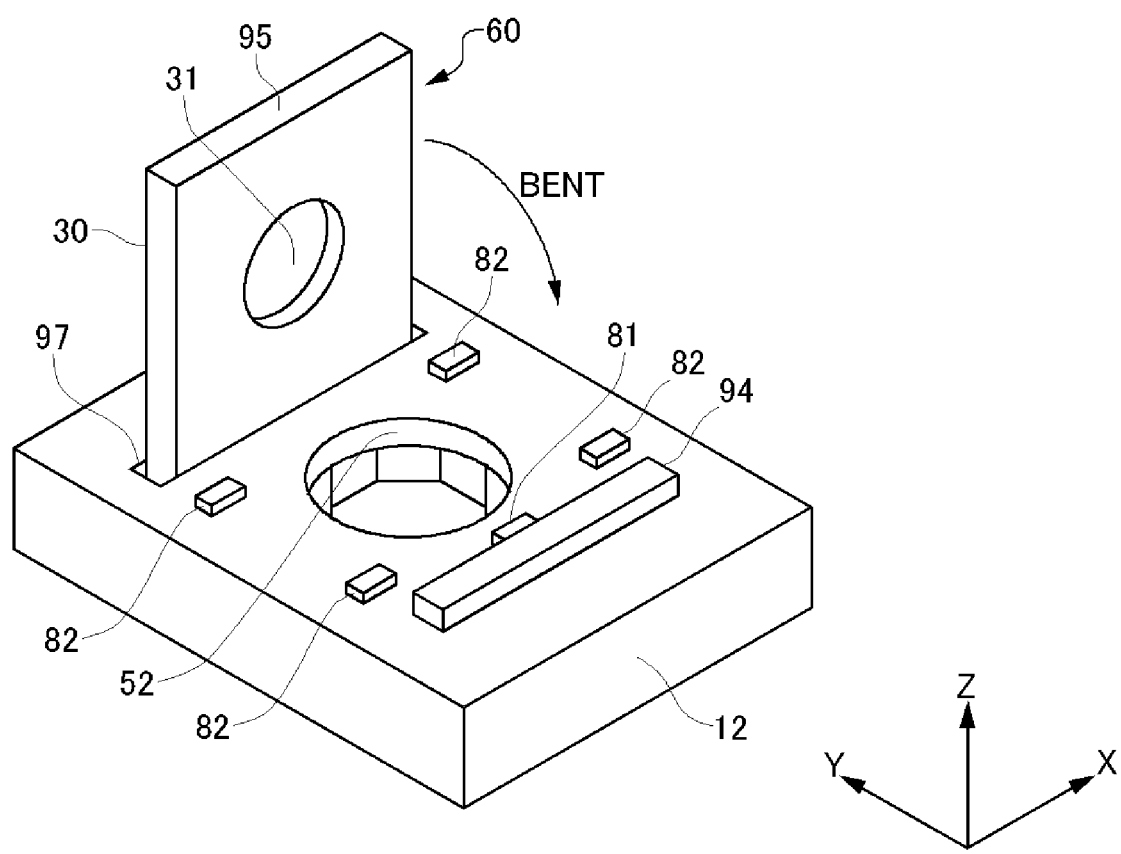
FIG. 15 is a perspective view schematically showing a main terminal 60 in the semiconductor device 200.

FIG. 15 is a perspective view schematically showing a main terminal 60 in the semiconductor device 200. The main terminal 60 in the present example is fixed to a bottom portion 16 by one foot portion. Also, the main terminal 60 has one side surface portion. The principal surface portion 30 is provided extending from the side surface portion.

The main terminal arrangement portion 12 is provided with a slit 97 through which the main terminal 60 passes. In the main terminal 60, the side surface portion and the principal surface portion 30 are formed on the same plane, and the principal surface portion 30 is exposed above the slit 97.

The lid portion 24 is put on the bottom portion 16, and consequently the main terminal 60 passes through the slit 97. The principal surface portion 30 exposed above the slit 97 is bent toward the main terminal arrangement portion 12 to thereby make the main terminal arrangement portion 12 and the principal surface portion 30 face each other.

Also, the front surface of the main terminal arrangement portion 12 is provided with an end surface facing portion 94 at a position facing the end surface 95 of the bent principal surface portion 30. At least one of the end surface facing portion 94 and the end surface 95 is provided with an end surface protruding portion 81. Such a structure also allows the position of the main terminal 60 to be accurately defined.

Figure 16:
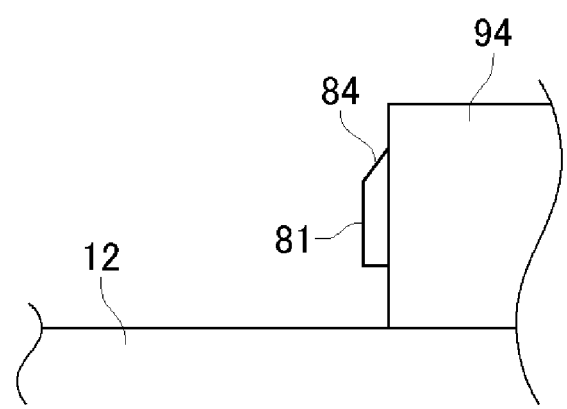
FIG. 16 is a side view showing an example of the shape of an end surface protruding portion 81.
Figure 16:
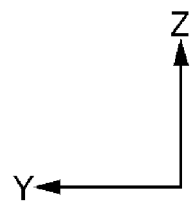

FIG. 16 is a side view showing an example of the shape of the end surface protruding portion 81. The end surface protruding portion 81 has, on its upper end, a tapered portion 84. The tapered portion 84 has a thickness that is smaller at its upper locations. This allows the end surface protruding portion 81 and the end surface 95 of the principal surface portion 30 to easily contact each other, by bending the principal surface portion 30.

Figure 17:
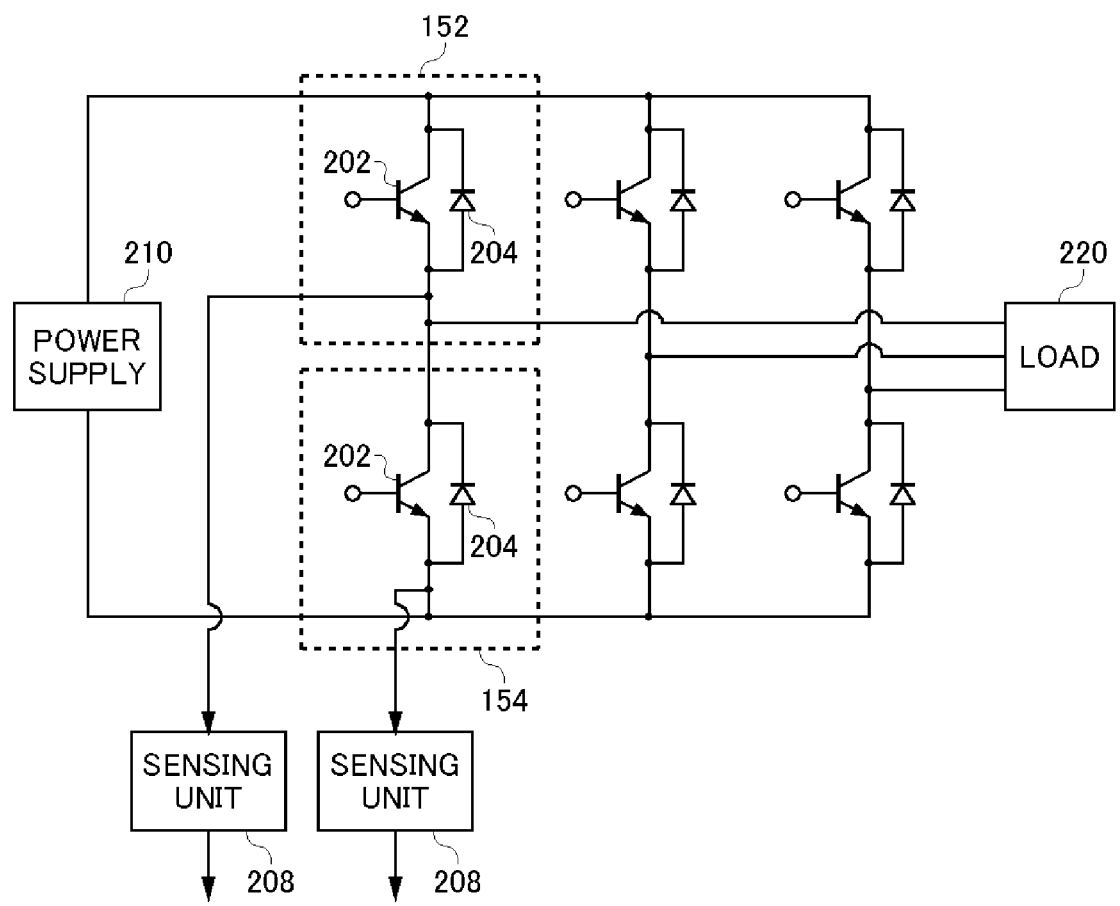
FIG. 17 is a diagram showing an example of a circuit 300 that includes an electronic circuit housed in the semiconductor device 100.

FIG. 17 shows an example of a circuit 300 including an electronic circuit housed in the semiconductor device 100. The circuit 300 in the present example is a three-phase inverter circuit provided between a power source 210 and a load 220. The load 220 is, for example, a three-phase motor. The circuit 300 converts electric power supplied from the power source 210 into three-phase signals (AC voltage) and supplies the converted signals to the load 220.

The circuit 300 includes three bridges corresponding to three-phase signals. Each bridge includes an upper arm 152 and a lower arm 154 provided in series between a positive side wiring and a negative side wiring. Each arm is provided with a transistor 202 such as an IGBT and a diode 204 such as an FWD. Signals of each phase are output from a connection point of the upper arm 152 and the lower arm 154.

The circuit 300 also includes two sensing units 208. One sensing unit 208 detects an electric current at the connection point of the upper arm 152 and the lower arm 154. The other sensing unit 208 detects an electric current at the connection point of the lower arm 154 and a reference potential.

In the present example, one semiconductor device 100 houses the upper arm 152, the lower arm 154 and the sensing unit 208 in one bridge. Each of three main terminals 60 may be connected to the power source 210 and the load 220. A pair of control terminals 40 may each be connected to the sensing unit 208 and a gate driving unit. In another example, one semiconductor device 100 may house one arm, or one semiconductor device 100 may house the entire circuit 300.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: casing portion; 12: main terminal arrangement portion; 13: control terminal arrangement portion; 14: through hole; 16: bottom portion; 18: through hole; 20: substrate; 22: electronic circuit; 24: lid portion; 25: opening; 26: pressing portion; 27: end surface facing portion; 28: joint portion; 29: terminal end portion; 30: principal surface portion; 31: through hole; 32: foot portion; 33: extending portion; 34: fixing portion; 35: side surface portion; 36: tip; 40: control terminal; 50: insertion portion; 51: locking portion; 52: depression; 53: front surface; 54: sidewall; 55: a principal surface facing portion; 60: main terminal; 61: end surface; 81: end surface protruding portion; 82: principal surface protruding portion; 83: side surface protruding portion; 84: tapered portion; 85: tapered portion; 90: triangle; 92: side surface groove portion; 94: end surface facing portion; 95: end surface; 97: slit; 100: semiconductor device; 152: upper arm; 154: lower arm; 200: semiconductor device; 202: transistor; 204 diode; 208: sensing unit; 210: power source; 220: load; 300: circuit

What is claimed is:

1. A semiconductor device comprising:
  a terminal portion having a through hole in a principal surface portion; and
  a casing portion having:
    a depression at a position facing the through hole;
    an end surface facing portion facing an end surface of the terminal portion; and
    a bottom portion on which a semiconductor chip is mounted and to which the terminal portion is fixed, wherein
  an end surface protruding portion is provided on the end surface facing portion, and
  the end surface protruding portion is entirely positioned on a side of the bottom portion with respect to an upper end of the terminal portion and contacts the end surface of the terminal portion, the end surface of the terminal portion being perpendicular to the principal surface portion of the terminal portion in a region facing the end surface protruding portion.

2. The semiconductor device according to claim 1, wherein
  the casing portion has:
    a lid portion that covers at least a part of the bottom portion and in which an opening for allowing the principal surface portion of the terminal portion to be exposed is provided; and
    an insertion portion inserted, in the opening of the lid portion, between the principal surface portion of the terminal portion and the bottom portion and having the depression at the position facing the through hole of the terminal portion, and the end surface facing portion is provided, in an insertion direction of the insertion portion, on the lid portion facing the end surface of the terminal portion.

3. The semiconductor device according to claim 2, wherein the end surface protruding portion has a tapered portion whose thickness gradually becomes larger as a distance to the bottom portion becomes longer.

4. The semiconductor device according to claim 2, wherein
the insertion portion has a principal surface facing portion facing the principal surface portion of the terminal portion, and
a principal surface protruding portion is provided on at least one of the principal surface portion and the principal surface facing portion.

5. The semiconductor device according to claim 4, wherein
the device comprises:
a plurality of the terminal portions; and
sets of at least three of the principal surface protruding portions, and
the sets are respectively provided on the terminal portions.

6. A semiconductor device comprising:
a terminal portion having a through hole in a principal surface portion; and
a casing portion having:
a depression at a position facing the through hole;
an end surface facing portion facing an end surface of the terminal portion;
a bottom portion on which a semiconductor chip is mounted and to which the terminal portion is fixed;
a lid portion that covers at least a part of the bottom portion and in which an opening for allowing the principal surface portion of the terminal portion to be exposed is provided; and
an insertion portion inserted, in the opening of the lid portion, between the principal surface portion of the terminal portion and the bottom portion and having the depression at the position facing the through hole of the terminal portion, wherein
an end surface protruding portion is provided on at least one of the end surface and the end surface facing portion,
the end surface facing portion is provided, in an insertion direction of the insertion portion, on the lid portion facing the end surface of the terminal portion,
the insertion portion has a principal surface facing portion facing the principal surface portion of the terminal portion,
a principal surface protruding portion is provided on at least one of the principal surface portion and the principal surface facing portion,
the terminal portion has a side surface portion coupled to the principal surface portion and sandwiched by a sidewall of the insertion portion and an inner wall of the lid portion, and a side surface protruding portion is provided on at least one of the side surface portion of the terminal portion and the sidewall of the insertion portion.

7. The semiconductor device according to claim 6, wherein the side surface protruding portion has a tapered portion whose thickness gradually becomes larger in the insertion direction as a distance to the end surface facing portion of the lid portion becomes longer.

8. The semiconductor device according to claim 6, wherein
the terminal portion further comprises a foot portion coupled to the side surface portion and fixed to the bottom portion of the casing portion,
the casing portion has a pressing portion that presses the foot portion toward the bottom portion of the casing portion,
the principal surface protruding portion is provided on the principal surface facing portion of the insertion portion and presses the principal surface portion of the terminal portion in a direction away from the bottom portion of the casing portion.

9. The semiconductor device according to claim 8, wherein the side surface protruding portion is arranged, within a plane parallel to the side surface portion of the terminal portion, in a triangle formed by two of the principal surface protruding portions provided close to the side surface portion and a connection point of the pressing portion and the foot portion.

10. The semiconductor device according to claim 8, wherein
the device comprises:
a plurality of the terminal portions aligned along the insertion direction; and
a plurality of the side surface protruding portions, and
the side surface protruding portions are respectively provided correspondingly to the terminal portions.

11. The semiconductor device according to claim 10, wherein a side surface groove portion fitted with the side surface protruding portion is provided on one of the side surface portion of the terminal portion and the sidewall of the insertion portion correspondingly to one of the terminal portions that is provided nearest in the insertion direction.

12. The semiconductor device according to claim 10, wherein
the foot portion has:
an extending portion extending in the insertion direction; and
a fixing portion provided extending from any of ends of the extending portion in the insertion direction toward the bottom portion of the casing portion and fixed to the bottom portion,
the fixing portion of at least one of the terminal portions is provided on the end of the extending portion closer to the end surface protruding portion,
the fixing portion of at least one of the terminal portions is provided on the end of the extending portion farther from the end surface protruding portion, and
a position of the principal surface protruding portion in each of the terminal portions is different depending on a position of the fixing portion.

* * * * *